(12) United States Patent
Lin et al.

(10) Patent No.: US 6,258,732 B1
(45) Date of Patent: Jul. 10, 2001

(54) METHOD OF FORMING A PATTERNED ORGANIC DIELECTRIC LAYER ON A SUBSTRATE

(75) Inventors: Qinghuang Lin; Rebecca D. Mih, both of Wappingers Falls; Kevin S. Petrarca, Newburgh, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/244,936

(22) Filed: Feb. 4, 1999

(51) Int. Cl.⁷ .................................................. H01L 21/469
(52) U.S. Cl. ........................ 438/780; 438/625; 438/638; 438/700
(58) Field of Search ..................... 438/780, 700, 438/738, 638, 625

(56) References Cited

U.S. PATENT DOCUMENTS

| | | | |
|---|---|---|---|
| 4,770,974 | 9/1988 | Hiroaka | 430/270 |
| 5,114,530 | 5/1992 | Rao et al. | 156/653 |
| 5,349,155 | * 9/1994 | Yamagishi et al. | 219/121.71 |
| 5,474,956 | 12/1995 | Trask et al. | 437/173 |
| 5,482,894 | 1/1996 | Havemann | 437/195 |
| 5,877,076 | * 3/1999 | Dai | 438/597 |
| 6,114,085 | * 11/1998 | Padmanaban et al. | 430/270.1 |
| 6,184,121 | * 7/1998 | Buchwalter et al. | 438/422 |
| 6,188,125 | * 2/2000 | Havemann | 257/640 |

* cited by examiner

Primary Examiner—David Nelms
Assistant Examiner—Renee' R. Berry
(74) Attorney, Agent, or Firm—Scully, Scott, Murphy & Presser; Steven Capella, Esq.

(57) ABSTRACT

An organic dielectric material is patterned on a substrate in a process utilizing a patterned resist which contains a metalloid or metallic element at the time of pattern transfer to the organic dielectric layer. The organic dielectric layer is preferably patterned using an oxygen etching process, most preferably oxygen reactive ion etching. The process advantageously avoids the need for a hard mask.

23 Claims, 2 Drawing Sheets

METHOD OF FORMING A PATTERNED ORGANIC DIELECTRIC LAYER ON A SUBSTRATE

FIELD OF THE INVENTION

The present invention provides a process of forming a patterned organic dielectric layer on a substrate by utilizing an imageable resist, wherein said imageable resist comprises a metalloid-containing or metal-containing imageable resist or a resist which can be converted into a metalloid-containing or metal-containing imageable resist prior to or after patterning. The processing steps of the present invention eliminate the need for employing hard inorganic cap layers to protect the underlying organic dielectric layer during patterning.

BACKGROUND OF THE INVENTION

The manufacturing of integrated circuits has been significantly improved by the development of new low dielectric constant organic materials ($\in$=4 or less) which are easily etched in oxygen environments. These new organic dielectrics can withstand temperatures in excess of 300° C. without degradation. Thus, they are highly suitable for use in back-end-of-the-line (BEOL) processing.

In order to pattern low dielectric constant organic materials, the etch rate of any resist applied thereto must be less than that of the low dielectric constant organic material. However, since the etch rates of the low dielectric constant organic materials and prior art resists are substantially the same in oxygen etching ambients, inorganic hard masks, i.e. caps, such as $Si_3N_4$, $SiO_2$ and silicon oxynitride are generally employed to improve the etch rate (i.e., to allow the use of more aggressive etch environments while achieving a selective etch).

The inclusion of a hard inorganic mask layer introduces several complexities into the integrated circuit fabrication process. For one thing, the hard mask layer must be patterned to match the pattern of the photoresist layer prior to patterning the low dielectric constant organic material.

A second problem associated with the use of an inorganic hard mask layer is that the dielectric constant of such materials are high (on the order of 7.0 or higher). As such, the inclusion of a hard inorganic mask layer increases the overall dielectric constant of the resultant film stack. Thus, the inclusion of a hard inorganic cap serves to defeat the purpose of utilizing the organic dielectric layer in the first place, i.e. reduction of the dielectric constant of the film stack.

Yet a third problem associated with the utilization of a hard inorganic cap layer is that, if the organic dielectric is employed as a sacrificial template (e.g., for copper wiring), it is necessary to eliminate the hard masking material before the organic dielectric can be removed after the templating function has been performed.

Attempts have been made in the prior art to overcome the aforementioned problems associated with the use of a hard inorganic cap layer. One such method, commonly employed in the art, is the removal of the hard inorganic cap layer by reactive ion etching (RIE). Unfortunately, such RIE processes typically employ fluorine-containing compounds as the active species. Fluorine-containing compounds not only remove the thin hard inorganic cap layer, but tend to etch the organic dielectric layer and thus reduce pattern fidelity in the lateral direction.

A further expedient employed to remove the hard inorganic cap layer is the utilization of a wet etch. Wet etches, which typically use hot phosphoric acid as an etchant, are not compatible with copper wiring found in many BEOL applications. Furthermore, wet etches often provide isotropic etching which may create undercuts in the patterned regions.

In view of the above identified problems associated with hard inorganic cap layers, there is a need to provide a new method which can be used to pattern low dielectric constant organic materials which eliminates the use of a hard inorganic cap layer in the patterning process.

SUMMARY OF THE INVENTION

The present invention provides a new process of patterning low dielectric constant organic materials in BEOL processing which eliminates the need for utilizing a hard inorganic cap layer. The inventive simplifies the amount of steps required to pattern the organic dielectric material. This elimination of various materials and/or processing steps advantageously results in a more cost efficient process.

In one aspect, the invention encompasses a process of forming a patterned organic dielectric layer on a substrate. Specifically, the process of the invention comprises the following steps:

(a) forming a layer of an organic dielectric material on a substrate;

(b) providing a patterned layer of resist on the organic dielectric material layer, wherein the resist contains a metalloid or metallic element, the patterned resist layer leaving areas of the organic dielectric material layer exposed;

(c) etching the exposed areas of the organic dielectric material; and (d) removing remaining portions of the patterned resist.

Step (b) preferably includes applying an imageable resist layer on the organic dielectric layer and patterning the resist layer using lithographic techniques. The metalloid or metal may be present in the resist as applied or may be added to the resist at some point before step (c). The etching step is preferably carried out under oxygen etching conditions which are effective in converting the metalloid or metallic element in the resist to a non-volatile refractory oxide. Preferably, the etching of step (c) is oxygen reactive ion etching ($O_2$ RIE).

The resist may be a positive tone or negative tone resist. The metalloid or metal contained in the resist at etching preferably forms a non-volatile refractory oxide in an oxygen etching environment. A highly preferred metalloid for use in the present invention is Si.

These and other aspects of the invention are described in further detail below.

DETAILED DESCRIPTION OF THE INVENTION

Figure 1A:
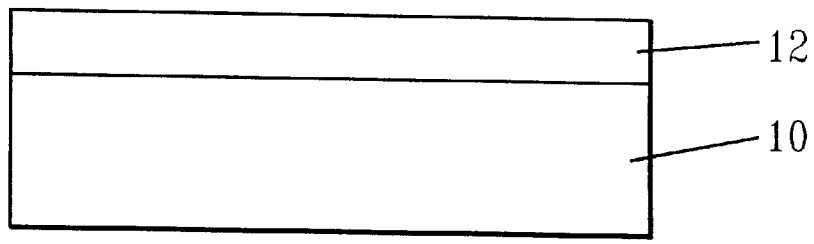
FIGS. 1(a)–(f) illustrate the various processing steps employed in one embodiment of the present invention wherein a positive tone imageable resist is employed.

The process of the invention utilizes a resist material which, due to the presence of a metalloid or metallic element therein, forms a film which is more etch resistant to etching (especially oxygen etching) than the underlying organic dielectric material. That is, the incorporation of a metalloid or metallic element in the imageable resist, prior to or after patterning, provides higher oxygen etch selectivity versus the organic dielectric. This feature allows one to pattern organic dielectric materials without the need of a hard inorganic dielectric material layer (i.e., a hard mask). Moreover, the above feature allows for patterning of a low dielectric constant organic material (∈=4 or below) without sacrificing the photolithographic response/resolution.

The processes of the invention for forming a patterned organic dielectric material on a substrate will now be described in greater detail by referring to the drawings that accompany this application. It is noted that like reference numerals are used in the drawings for describing like and corresponding elements.

Referring to FIGS. 1(a)–(f), there is shown one embodiment of a process of the invention wherein a positive tone imageable resist is employed. Although illustration is shown for a positive tone imageable resist, the invention works well with negative tone resists. Where a positive resist is employed, the exposure of the imageable resist renders the exposed areas more soluble than the unexposed areas. The exposed areas of the imageable resist are then removed in the development step and the pattern is formed. Where a negative resist is employed, the unexposed areas of the resist are removed in the development step.

FIG. 1(a) shows a structure which comprises a substrate 10 having a layer of an organic dielectric material 12 formed thereon. Examples of suitable substrates which can be employed in the invention include: semiconductor chips, wafers, circuit boards, interconnect structures, metals and other like substrates. Preferably, the substrate is composed of or contains a semiconducting material such as Si, Ge, GeSi, GaAs, InAs, InP and other III/V compounds. The semiconducting material may be doped and/or undoped. The substrate may contain active device regions or wiring regions such as are typically found in integrated circuit chips. For clarity, such device or wiring regions are not shown in the drawings, but nevertheless, may be present in substrates used in the processes of the invention.

The organic dielectric material 12 preferably does not containing any substantial amount of refractory oxide-forming metalloids or metallic elements. The organic dielectric material preferably has a dielectric constant, ∈, of about 4.0 or less, more preferably, less than about 3.0. If the organic dielectric layer contains metals or metalloids, their presence should be of kind and amount that does not adversely affect the selectivity afforded by the metalloid/metal-containing resist employed in the process of the invention. Suitable organic dielectric materials that can be employed in the invention include, but are not limited to: diamond-like carbon (DLC), fluorinated DLC, polyimides, fluorinated polyimides, parylene-N, parylene- F, benzocyclobutanes, poly(arylene ethers), polytetrafluoroethylene (PTFE) derivatives marketed by Du Pont de Nemours, Inc. under the registered trademark Teflon AF, poly(naphthalenes), poly(norbornenes), foams of polyimides, organic xerogels, porous PTFE and other nano-, micro- or macro-porous organic materials.

The organic dielectric material is preferably formed on the surface of substrate 10 using conventional deposition techniques. For example, chemical vapor deposition, plasma vapor deposition, sputtering, dip coating, spin-on coating, brushing, spraying and other like deposition techniques may be employed. The resultant organic dielectric layer preferably has a thickness of about 500 to 10,000 Å, more preferably, about 2000 to 9000 Å.

If desired, organic dielectric layer 12 may be annealed prior to forming the imageable resist thereon. When annealing is performed, it is preferably carried out in a substantially inert ambient such as He or $N_2$, at a temperature of about 300° to 400° C. for a time period of about 1 to 5 hrs. Annealing may be carried out using a single ramp and soak cycle, or multiple ramp and soak cycles can be used. If desired, a minor amount of oxygen (<0.1 wt. %) may be added to the inert ambient.

Figure 1B:
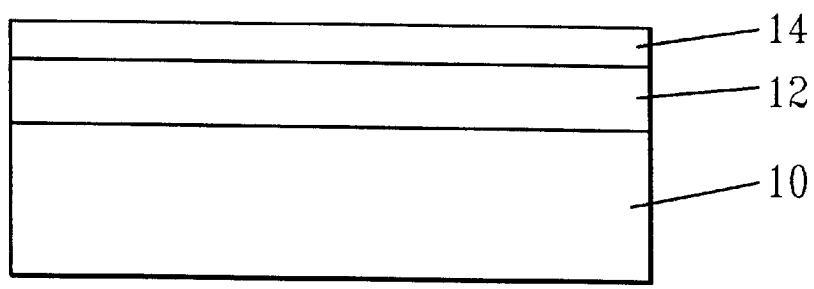

Next, as shown in FIG. 1(b), an imageable resist layer 14 is formed on top of organic dielectric layer 12, preferably using conventional deposition techniques. Examples of such conventional deposition processes include: spin-on coating, chemical vapor deposition, plasma vapor deposition, sputtering, dip coating and other like deposition techniques.

The imageable resist layer thickness is determined by the etch selectivity and the thickness of the underlying organic dielectric. The resist layer thickness is preferably such that the patterned resist should provide sufficient etch resistance to achieve sufficient image transfer to the underlying organic dielectric. The thickness of the imageable resist layer is preferably about 500 to 10,000 Å, more preferably about 2,000 to 5,000 Å.

The imageable resist employed in the present invention can be any imageable material or composition that inherently contains a sufficient amount of a metalloid or metallic element to achieve adequate oxygen etch selectivity between the imageable resist and the underlying organic dielectric material. The metalloid or metallic element may be inherently present in the base polymer or it can be present in other components of the resist composition. Alternatively, the desired metalloid or metallic material can be incorporated into the resist after application of the resist layer 14 over organic dielectric layer 12 (before or after patterning of the resist layer), but prior to oxygen etching of the organic dielectric layer. In either case, the content of metalloid or metallic element in the patterned imageable resist at the time of oxygen etching of the organic dielectric is preferably greater than about 5 wt. %, more preferably, greater than about 10 wt. %.

The metalloid or metallic element employed in the resist layer may be any metalloid or metal capable of forming a non-volatile refractory oxide in an oxygen reactive ion etching environment. Suitable metalloids or metallic elements that can be employed in the present invention include elements selected from Groups IIA, IVB, VIII, IB, IIIA or IVA of the Periodic Table of Elements (CAS version). Suitable metalloids or metallic elements include, but are not limited to: Mg, Ca, Si, Ge, Sn, Ti, Zr, Fe, Co, Ni, Ru, Rh, Pd, Ir, Pt, Cu, Ag and Au. Alloys of the same are also contemplated herein as well as compounds or complexes which contain the same. A highly preferred metalloid for use in the present invention is Si.

The imageable resist is preferably a resist composition that includes at least a base polymer resin (metalloid-containing or metal-containing or free of metalloid/metal). Preferably, the imageable resist composition undergoes chemical changes when subjected to radiation. These chemical changes alter the solubility of the exposed regions such that the desired patterns can be obtained after development with the appropriate solvents. In the case of positive tone resists, the exposed regions are removed by the developer solvent, whereas for negative tone resists, the unexposed areas are removed.

Other components that may be present in the resist include: a solvent, a photoacid or photobase generator, a crosslinking agent, an acid or a base, a photosensitizer or a surfactant. The solvent, photoacid/photobase generators, acid or base additives, photosensitizer and surfactant employed in the imageable resist are may be selected from conventional compounds that are well known to those skilled in the art; therefore a detailed description of those components is not given herein. It should be understood that solvent may be present in the resist composition on application to the substrate, but is typically substantially removed from the applied resist before radiation exposure.

When the metalloid or metallic element is present in the imageable resist composition to be applied to the substrate, it can be present in the base polymer itself and/or in one or more of the other components of the resist composition which remain in the patterned resist. Preferably, the metalloid or metallic element is present in the base polymer itself.

When the metalloid or metallic element is introduced into the resist after resist film formation (but prior to etching), the metalloid or metallic element can be incorporated into the resist prior to oxygen etching using a gas or liquid phase process wherein the metalloid or metallic element is introduced into the resist by diffusion. Alternatively, the metalloid or metallic element can be incorporated into the resist through chemical bonding or physical interactions or other technique.

The imageable resist is preferably a chemically amplified resist. The term "chemically amplified resist" is used herein to denote a resist where radiation exposure of the resist generates a catalyst that catalyzes a cascade of chemical transformations (with or without subsequent heating) to change the solubility of the exposed regions. Preferably, the chemically amplified resists employed in the present invention comprise polymer resins which contain acid-sensitive or base-sensitive protecting groups (i.e. positive tone resists) or a crosslinkable functionality (negative tone resists). Typical chemical amplified resists are acid or base catalyzed wherein exposure of the resist to radiation generates a strong acid or base that catalyzes the deprotection (or crosslinking in the case of negative resist) of the base polymer resin. Subsequent development with an appropriate solvent generates the desired patterned resist.

Positive tone resists useful in the processes of the invention preferably contain a base polymer resin derived from at least one of the following: novolak, hydroxystyrene, acrylates, methacrylates, acrylamides, methacrylamides, itconates, itaconic half esters, cycloolefins, silsesquioxanes, siloxanes, silanes and silynes. Silsequioxanes, siloxanes, silanes and silynes represent preferred base polymers wherein the metalloid, Si, is present in the base polymer. Highly preferred silicon-containing polymers include: poly (hydroxyphenyl alkyl)silsesquioxane and poly (hydroxyphenyl alkyl)siloxane, wherein alkyl is a $C_{1-32}$ moiety.

An alternative base polymer is one which contains a silicon-containing substituent bonded to a polymeric backbone. The silicon-containing base polymer may be a homopolymer or copolymer containing at least one monomer having a silicon-containing substituent. The silicon-containing substituent may or may not be acid sensitive. Typically, however the silicon-containing substituent is acid sensitive when containing a silyl silylethyl moiety. Preferably, the silicon-containing substituent is attached to a monomer selected from the group consisting of hydroxystyrene, an acrylate, a methacrylate, an acrylamide, a methacrylamide, itaconate, an itaconic half ester or a cycloolefin. Preferred silicon-containing substituents include: siloxane, silane and cubic silsesquioxanes. The silicon-containing polymer may further include silicon-free monomers such as those selected from the group consisting of styrene, hydroxystyrene, acrylic acid, methacrylic acid, itaconic acid and an anhydride such as maleic anhydride and itaconic anhydride.

Preferred monomers containing silicon-containing substituents are trimethylsilyl alkyl acrylate, trimethylsilyl alkyl methacrylate, trimethylsilyl alkyl itaconate, tris (trimethylsilyl)silyl alkyl acrylate tris(trimethylsilyl)silyl alkyl methacrylate, tris(trimethylsilyl)silyl alkyl itaconate, tris(trimethylsilyloxy)silyl alkyl acrylate, tris (trimethylsilyloxy)silyl alkyl methacrylate, tris (trimethylsilyloxy)silyl alkyl itaconate, alkylsilyl styrene, trimethylsilylmethyl(dimethoxy)silyloxy alkyl acrylate, trimethylsilylmethyl(dimethoxy)silyloxy alkyl methacrylate, trimethylsilylmethyl(dimethoxy)silyloxy alkyl itaconate, trimethylsilyl alkyl norbornene-5-carbosylate alkyl, tris(trimethylsilyl)silyl alkyl norbornene-5-carboxylate and tris(trimethylsilyloxy)silyl alkyl norbornene-5-carboxylate, wherein alkyl is a $C_{1-15}$ moiety. In a highly preferred embodiment, the alkyl is a $C_2$ moiety.

The positive tone resists can be fully or partially protected with an acid-sensitive or base-sensitive protecting groups, such as those known in the art.

Preferred negative tone resists contain base polymer resins that are capable of being crosslinked with a crosslinking agent. Examples of crosslinkable polymers include: poly (hydroxyphenyl alkyl)silsesquioxane and poly (hydroxyphenyl alkyl)siloxane, wherein alkyl is a $C_{1-32}$ moiety; whereas examples of crosslinking agents include: melamines and urils.

In embodiments wherein the metalloid or metallic element is added to the imageable resist after application of the resist layer, the metalloid or metallic element may be added as an elemental metalloid or metallic element, an alloy of the same, or a metalloid or metal containing compound or complex. In embodiments wherein Si is employed, a silylating agent such as silyl amine may be used. Silylation may be carried out in the gas phase or alternatively it may be carried out in a liquid phase process.

Figure 1C:
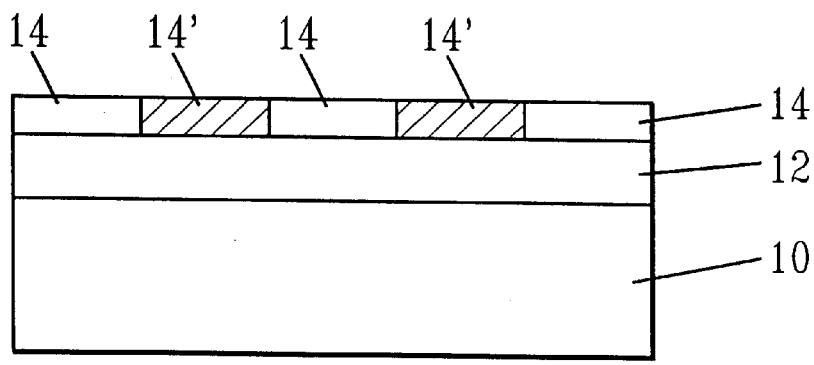
Figure 1D:
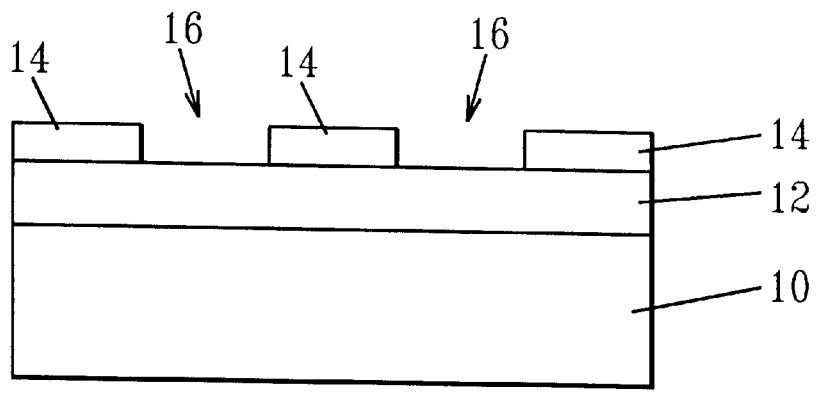

The next step of the present invention which involves patterning the imageable resist is shown in FIG. 1(c). Specifically, the imageable resist is preferably patterned using a three step process which includes exposure, post-baking and developing. In some instances, post-baking may be eliminated.

A pre-baking step may be optionally employed prior to exposure. This step is desirable if the imageable resist has a solvent content above 5.0%. When a pre-bake step is employed, the applied resist layer structure shown in FIG. 1(b) is baked, i.e. heated, to a temperature of preferably about 60° to 250° C. for a time period of about 30 to 300 secs. More preferably, the optional pre-bake step is carried out at a temperature of about 100° to 140° C. for a time period of about 60 to 120 secs.

The unbaked or pre-baked imageable resist layer is then pattern-wise exposed to radiation using a masked or maskless lithographic process. The exposure process may be carried out using mid-UV, deep UV (243, 193, 157 and 129 nm), extreme-UV, e-beam, x-ray or ion-beam radiation or maskless scanning probe lithography.

After exposure, the imageable resist is then preferably post-baked at a temperature of about 60° to 250° C. for a time period of about 30 to 300 secs. More preferably, the exposed imageable layer is post-baked at a temperature of about 100° to 140° C. for a time period of about 60 to 120 secs. The above post-bake conditions are preferably sufficient to crosslink the imageable resist in the case of negative resist compositions.

After exposure and post-baking, the pattern shown in FIG. 1(c) is then developed using a suitable solvent. In the positive resist embodiment of the present invention, the exposed areas 14' are developed, i.e. removed, leaving unexposed areas of imageable layer 14 remaining on the surface of the low dielectric constant organic material. Preferred solvents' are aqueous alkaline developers such as aqueous tetramethylammonium hydroxide solutions. The resulting patterned resist structure shown in FIG. 1(d). As stated above, the drawings are specific for positive tone resist. If a negative tone resist were employed, the unexposed portions 14 of the imageable resist would be removed to obtain the desired patterned resist structure.

Figure 1E:
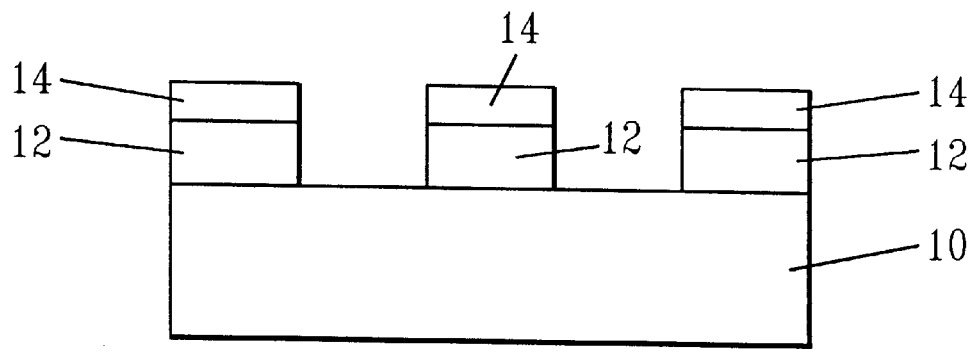

The organic dielectric layer is then patterned at exposed areas 16 of imageable resist 14 to provide the patterned structure shown in FIG. 1(e). Specifically, the organic dielectric may be patterned using conventional dry etching techniques which utilize an oxygen-containing ambient. Suitable oxygen-containing ambients include, but are not limited to: oxygen mixed with Ar, He or hydrocarbons; $CO_2$; $SO_2$; CO or ozone. Exemplary dry etching techniques that can be employed include: reactive ion etching, plasma etching and ion-beam etching. The oxygen etching conditions are preferably sufficient to convert the metalloid or metallic element in the resist to a non-volatile refractory oxide. This non-volatile refractory oxide functions as an etch mask. Thus, allowing one to pattern the organic dielectric layer.

Figure 1F:
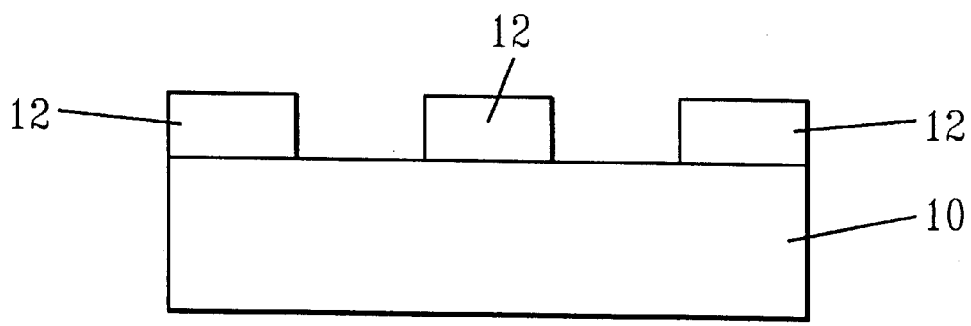

After patterning of the organic dielectric layer, the remaining imageable resist layer 14 may be removed using standard stripping techniques. Preferably, fluorine-based chemistry is employed to remove the remaining areas of imageable resist while avoiding lateral sidewall etching of the patterned organic dielectric material. Specifically, the remaining imageable resist layer is preferably removed using $CF_4$ or $CHF_3$ gases. The final structure is shown in FIG. 1(f).

While the invention has been particularly shown and described with respect to preferred embodiments thereof, it will be understood by those skilled in the art that the foregoing and other changes in form and details may be made therein without departing from the spirit and scope of the invention.

What is claimed is:

1. A process of forming a patterned organic dielectric layer on a substrate comprising:
   (a) forming a layer of an organic dielectric material on a surface of a substrate, said organic dielectric not including an inorganic capping layer formed thereon;
   (b) providing a patterned layer of resist on the organic dielectric material, wherein the resist contains a metalloid or metallic element, the patterned resist layer leaving areas of the organic dielectric material exposed;
   (c) etching the exposed areas of the organic dielectric material; and
   (d) removing remaining portions of the patterned resist.

2. The process of claim 1 wherein step (b) comprises:
   (i) applying a resist containing a metalloid or metallic element over said organic dielectric layer,
   (ii) patternwise exposing said resist to radiation, and
   (iii) removing portions of said resist by contacting said resist layer with a developer.

3. The process of claim 1 wherein step (b) comprises:
   (i) applying a resist over said organic dielectric layer,
   (ii) patternwise exposing said resist to radiation,
   (iii) adding a metalloid or metal to said resist layer, and
   (iv) removing portions of said resist by contacting said resist layer with a developer.

4. The process of claim 1 wherein said organic dielectric material is selected from the group consisting of diamond-like carbon (DLC), fluorinated DLC, polyimides, fluorinated polyimides, parylene-N, parylene-F, benzocyclobutanes, poly(arylene ethers), polytetrafluoroethylene derivatives, poly(naphthalenes), poly(norbornenes), foams of polyimides, organic xerogels and porous PTFE.

5. The process of claim 1 wherein said organic dielectric material layer is formed by chemical vapor deposition, plasma vapor deposition, sputtering, dip coating, spin-on coating, brushing or spraying.

6. The process of claim 1 wherein said organic dielectric material layer has a thickness of about 500 to 10,000 Å.

7. The process of claim 1 wherein said organic dielectric material is annealed prior to step (b) in a substantially inert gas ambient at a temperature of about 300° to 400° C. for a time period of about 1 to 4 hrs.

8. The process of claim 1 wherein said resist layer has a thickness of about 500 Å to 10,000 Å.

9. The process of claim 1 wherein said metalloid or metallic element is capable of forming a non-volatile refractory oxide upon oxygen etching.

10. The process of claim 9 wherein said metalloid or metallic element comprises at least one metal or metalloid selected from the group consisting of elements from Groups IIA, IVB, VIII, IB, IIIA or IVA of the Periodic Table of Elements.

11. The process of claim 1 wherein said resist contains silicon.

12. The process of claim 1 wherein said resist contains an acid-sensitive polymer resin is derived from novolak, hydroxystyrene, an acrylate, a methacrylate, an acrylamide, a methacrylamide, itaconate, itaconic half ester, a cycloolefin, a silsesquioxane, a siloxane, a silane or a silyne.

13. The process of claim 12 wherein acid sensitive polymer resin is derived from a poly(hydroxyphenyl alkyl) silsesquioxane or a poly(hydroxyphenyl alkyl)siloxane, wherein alkyl is a $C_{1-32}$ moiety.

14. The process of claim 1 wherein said resist includes polymer having a silicon-containing substituent bonded to a polymeric backbone.

15. The process of claim 14 wherein said silicon-containing substituents are selected from the group consisting of siloxane, silane or cubic silsesquioxane.

16. The process of claim 1 wherein said resist is a negative tone resist comprising a crosslinking agent and a polymer which is capable of being crosslinked by said crosslinking agent.

17. The process of claim 2 wherein said patterning step includes post-baking prior to step (iii).

18. The process of claim 2 wherein said exposure step is carried out using radiation selected from the group consisting of mid-UV, deep-UV, extreme-UV, e-beam, x-ray and ion-beam.

19. The process of claim 1 wherein said etching comprises oxygen reactive ion etching, oxygen plasma etching or oxygen ion beam etching.

20. The process of claim 1 wherein said metalloid or metallic element is oxidized into a non-volatile refractory oxide during said etching.

21. The process of claim 1 wherein said etching is carried out in an atmosphere comprising $CO_2$, $SO_2$, CO, ozone or oxygen mixed with Ar, He, $N_2$ or a hydrocarbon.

22. The process of claim 1 wherein said resist contains greater than about 5 wt. % of said metalloid or metallic element.

23. The process of claim 22 wherein said resist contains greater than about 10 wt. % of said metalloid or metallic element.

* * * * *

UNITED STATES PATENT AND TRADEMARK OFFICE
CERTIFICATE OF CORRECTION

PATENT NO.    : 6,258,732 B1
DATED         : July 10, 2001
INVENTOR(S)   : Q. Lin et al.

It is certified that error appears in the above-identified patent and that said Letters Patent is hereby corrected as shown below:

<u>Title page,</u>
Item [56], References Cited, U.S. PATENT DOCUMENTS:
"6,114,085   11/1998" should read -- 6,114,085   9/2000 --
"6,188,125   2/2000" should read -- 6,188,125   2/2001 --
"6,184,121   7/1998" should read -- 6,184,121   2/2001 --

Signed and Sealed this

Eleventh Day of June, 2002

*Attest:*

*Attesting Officer*

JAMES E. ROGAN
*Director of the United States Patent and Trademark Office*